(12) United States Patent
Park et al.

(10) Patent No.: US 6,600,370 B2
(45) Date of Patent: Jul. 29, 2003

(54) INTERMODULATION SIGNAL DETECTOR

(75) Inventors: Ung Hee Park, Taejon (KR); Sang Gee Kang, Taejon (KR); Heon Jin Hong, Taejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/119,338

(22) Filed: Apr. 8, 2002

(65) Prior Publication Data

US 2003/0030489 A1 Feb. 13, 2003

(30) Foreign Application Priority Data

Aug. 11, 2001 (KR) .......................... 2001-48543

(51) Int. Cl.[7] ................................ H03F 1/26
(52) U.S. Cl. ...................... 330/149; 330/136
(58) Field of Search ................ 330/136; 4/149, 4/126; 455/63

(56) References Cited

U.S. PATENT DOCUMENTS

| 4,885,551 A | 12/1989 | Myer | 330/52 |
| 5,148,117 A | 9/1992 | Talwar | 330/151 |
| 5,166,634 A | 11/1992 | Narahashi et al. | 330/151 |
| 6,002,300 A | * 12/1999 | Herbster et al. | 330/149 |
| 6,271,724 B1 | * 8/2001 | Neffling | 330/149 |
| 6,396,345 B2 | * 5/2002 | Dolman | 330/149 |
| 6,452,447 B2 | * 9/2002 | Kusunoki | 330/149 |

OTHER PUBLICATIONS

Control Circuit Compensates Error Loop in Feedforward Amplifiers by Ung Hee Park.
Ultra Linear/Feedforward Amplifier Design by D. Myer.
A DSP Controlled Adaptive Feedforward Amplifier Linearizer by S. Grant.

* cited by examiner

Primary Examiner—Robert Pascal
Assistant Examiner—Khanh Van Nguyen
(74) Attorney, Agent, or Firm—Blakely, Sokoloff, Taylor & Zafman

(57) ABSTRACT

An intermodulation signal detector is implemented in a non-linear super high frequency circuit for stably detecting an intermodulation signal regardless of the variations of non-linear characteristics of the super high frequency element and an external environment by using combined two transmission lines on which signals have the same amplitude and 180° different phases.

7 Claims, 3 Drawing Sheets

INTERMODULATION SIGNAL DETECTOR

FIELD OF THE INVENTION

The present invention relates to an intermodulation signal detector for use in a non-linear super high frequency circuit for stably detecting an intermodulation signal by using two transmission lines having the same amplitudes and different phases.

DESCRIPTION OF THE PRIOR ARTS

In general, if a super high frequency circuit having a non-linear characteristic receives signals having different frequencies, a new frequency signal is produced by an interaction of the received signals. Such a produced signal is called an intermodulation signal. The intermodulation signal is different from a converted signal of the received signal, which is generated by linear transmission operation of the super high frequency circuit. The intermodulation signal is produced from inside of the super high frequency circuit and acts as a noise disturbing the received signals. Therefore, the intermodulation signal diminishes an ability of transmitting information of a circuit.

A power amplifier generally produces a plenty of intermodulation signals due to power efficiency and non-linearity of amplifying devices.

A conventional intermodulation signal detector detects intermodulation signals by applying a power divider behind a transmission line, producing a control signal by using a frequency mixer and a frequency converter through a controller and controlling a variable attenuator and a variable phase converter, which are located in front of a power amplifier, in response to the control signal.

The above-mentioned conventional intermodulation signal detector is characterized as a controllable detector by the control signal of the controller.

FIG. 1 is a block diagram of a conventional intermodulation signal detector of a super high frequency circuit having non-linear characteristics. The conventional intermodulation signal detector uses a microprocessor as a controller for detecting an intermodulation signal.

The conventional intermodulation signal detector includes power dividers 120, 124 and 126, a variable attenuator 121, a variable phase converter 122, a non-linear super high frequency element 123, a subtracter 125, a frequency mixer 127, a receiver 128, a controller 129, a voltage control frequency generator 130 and transmission lines 101 to 116.

The power divider 120 receives an output signal of the transmission line 101 and distributes the power of the received signal to the reference transmission line 107 and the circuit transmission line 102.

The power distributed to the super high frequency circuit transmission line 102 is applied to the variable attenuator 121 and the variable phase converter 122, which are controlled by a voltage outputted from the controller 129.

The power transferred through the variable attenuator 121 and the variable phase converter 122 is applied to the non-linear super high frequency element 123 through the super high frequency transmission line 103. The non-linear super high frequency element 123 outputs the applied power together with an intermodulation signal through the transmission line 104 to the power divider 124, wherein the intermodulation signal is generated in the non-linear super high frequency element 123. The power divider 124 outputs the applied power and the intermodulation signal to the outside through the transmission line 105 and to the subtracter 125 through the transmission line 106.

The subtracter 125 compares a reference signal with the signal provided from the power divider 124, wherein the reference signal is the power transmitted from the power divider 120 through the transmission line 107. After performing the comparison process, the subtracter 125 subtracts the signal transmitted from the power divider 124 from the reference signal and outputs a subtracted signal to the power divider 126 through the super high frequency transmission line 108. Herein, the subtracted signal is the intermodulation signal. The power divider 126 provides the intermodulation signal to the outside through the super high frequency transmission line 109 and to the frequency mixer 127 through the super high frequency transmission line 110.

The frequency mixer 127 receives the intermodulation signal provided from the power divider 126 and a signal outputted from the voltage control frequency generator 230, mixes frequencies of the received signals and provides a mixed frequency signal to the controller 129 through the receiver 128.

In response to the mixed frequency signal inputted thereto through the receiver 128, the controller 129 controls the variable attenuator 121 and the variable phase converter 122 by using the control transmission line 115 and 116, respectively, to thereby output a signal having the same power amplitude and 180° reversed phase with the reference signal on the reference transmission line 107 to the subtracter 125 through the transmission line 106.

As a result, the subtracter 125 can output the subtracted signal only composed of the intermodulation signal.

In the meantime, since the conventional intermodulation signal detector uses a microprocessor as the controller 129, it is difficult to process data in real-time. Additionally, it is also difficult to stably detect the intermodulation signal regardless of variations of the non-linear characteristics of the super high frequency circuit and an external environment.

SUMMARY OF THE INVENTION

It is, therefore, a primary object of the present invention to provide an intermodulation signal detector of a non-linear super high frequency circuit for detecting in real-time an intermodulation signal generated at a super high frequency element having a non-linear characteristic.

Another object of the present invention is to provide an intermodulation signal detector of a non-linear super high frequency circuit for stably detecting intermodulation signals regardless of variations of non-linear characteristics of the super high frequency element and an external environment.

In accordance with an aspect of the present invention, there is provided an intermodulation signal detector for use in a super high frequency circuit, including: a first power dividing unit for dividing the power of a super high frequency signal inputted from the outside through a super high frequency transmission line, and outputting a power-divided signal; a clock generating unit for providing a clock signal; a varying unit for receiving the power-divided signal from the first power dividing unit, attenuating an amplitude of the power-divided signal according to an amplitude control signal, converting a phase of the power-divided signal in response to a phase control signal and providing a converted super high frequency signal having converted amplitude and phase; a non-linear super high frequency element for receiving the converted super high frequency signal and generating an output signal including the converted super high frequency signal and an intermodulation signal produced therein; a second power dividing unit for receiving the output signal of the non-linear super high frequency element, dividing the power of the output signal and outputting a power-divided output signal as a comparison signal; a third power dividing unit for receiving the power-divided signal from the first power dividing unit and dividing the power of the power-divided signal twice power-divided signal as a reference signal; a power combining unit for receiving the comparison signal and the reference signal and combining the received two signals to thereby detect the intermodulation signal; a phase control unit for receiving the comparison signal and the reference signal and generating DC voltages having a amplitude corresponding to the phases of the two signals to thereby produce the phase control signal for making of the phase difference between the comparison signal the reference signal 180°; and an amplitude control unit for receiving the comparison signal and the reference signal and generating DC voltages having a amplitude corresponding to the amplitudes of the two signals to thereby produce the amplitude signal for making the amplitude of the comparison signal identical to that of the reference signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION other objects and aspects of the invention will become apparent from the following description of the embodiments with reference to the accompanying drawings, which is set forth hereinafter.

Figure 1:
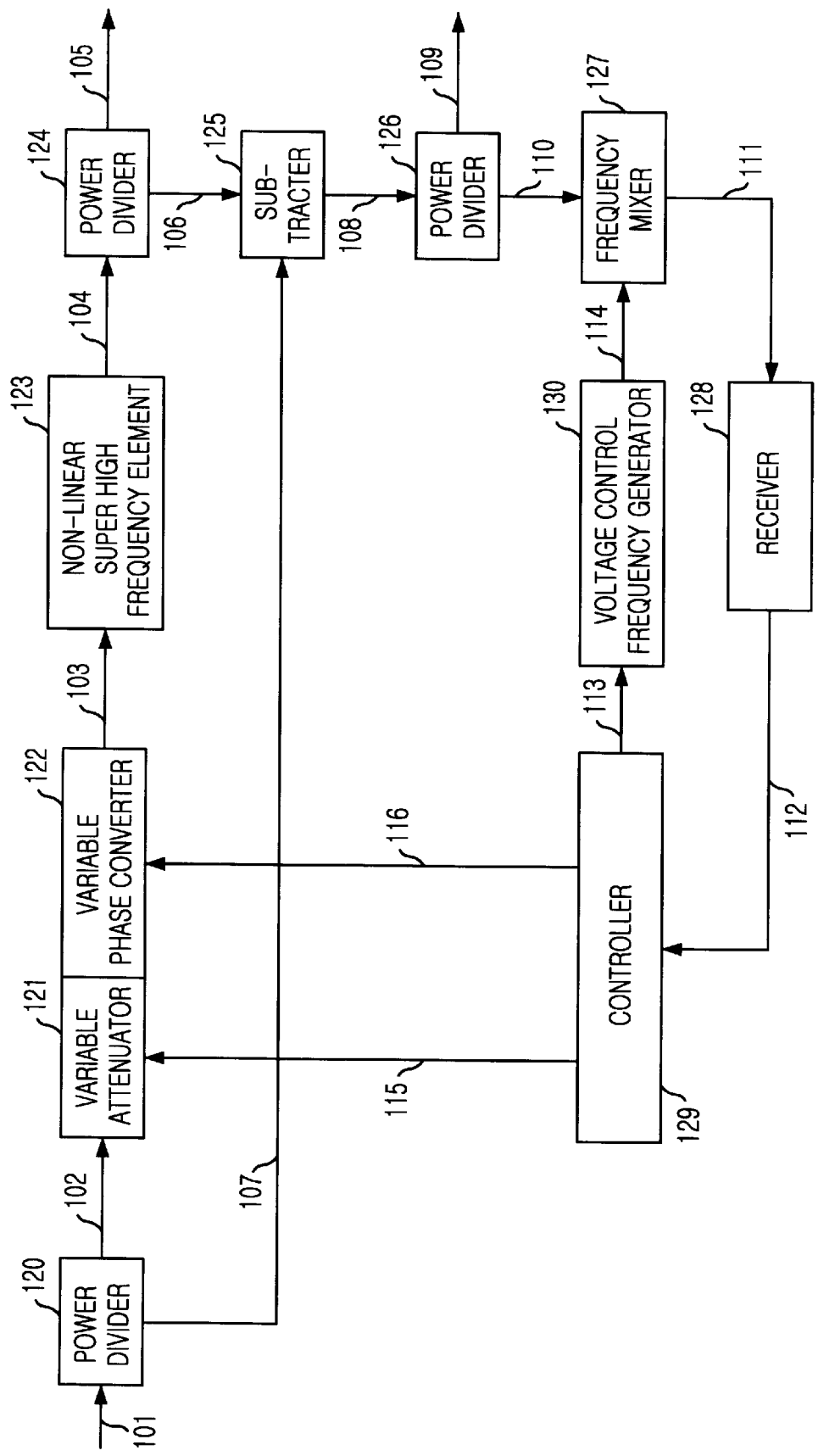
FIG. 1 provides a block diagram of a conventional intermodulation signal detector of a non-linear super high frequency circuit.
Figure 2:
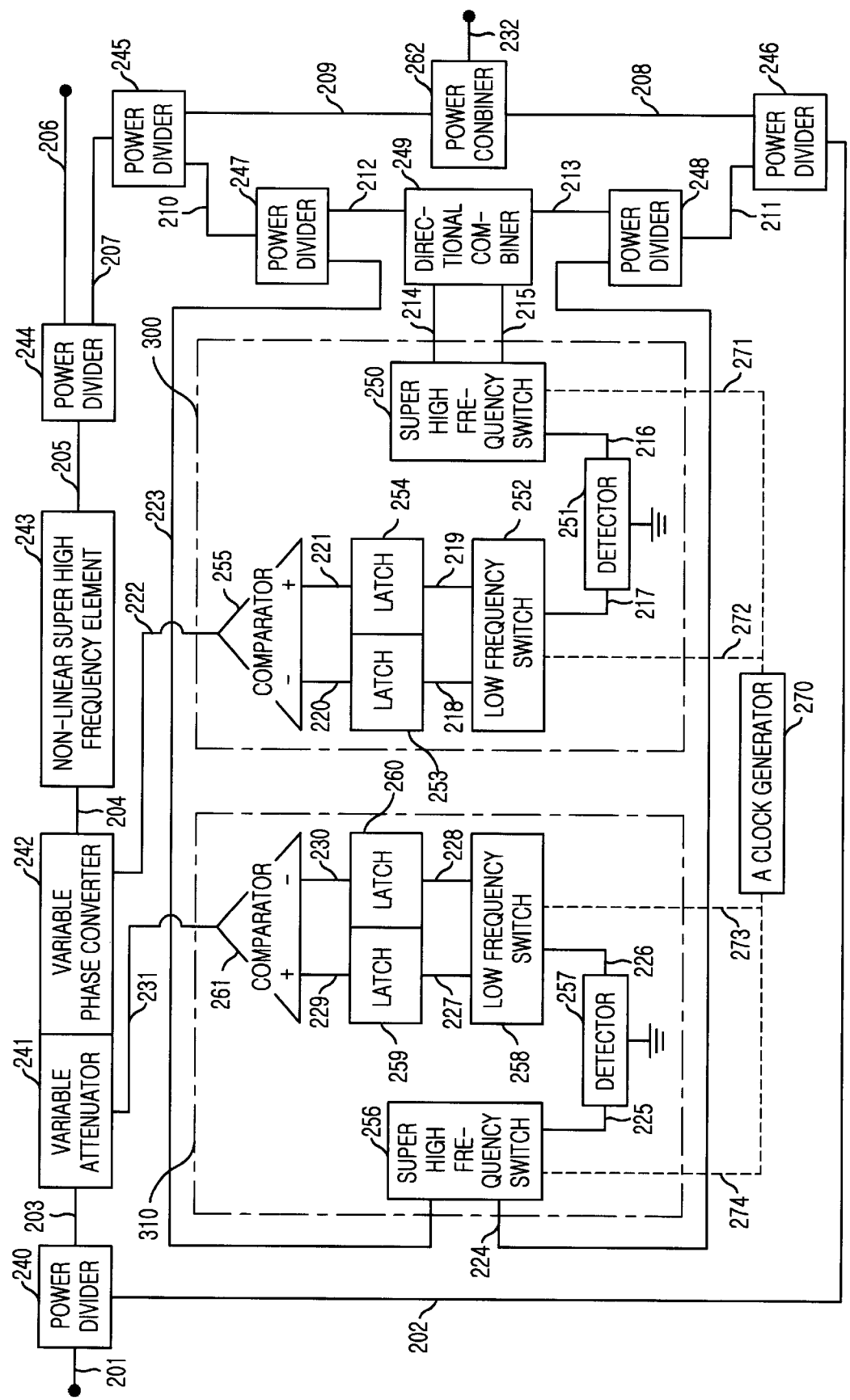
FIG. 2 illustrates a block diagram of an intermodulation signal detector of a non-linear super high frequency circuit in accordance with the present invention.

FIG. 2 shows a block diagram of an intermodulation signal detector of a non-linear super high frequency circuit in accordance with the preferred embodiment of the present invention.

The inventive intermodulation signal detector includes a number of power dividers 240 and 244 to 248, a variable attenuator 241, a variable phase converter 242, a non-linear super high frequency element 243, a directional combiner 249, a power combiner 222, a clock generator 270, a phase controller 300 and an amplitude controller 310.

The phase controller 300 includes a super high frequency switch 250, a detector 251, a low frequency switch 252, two latches 253 and 254 and a comparator 255.

The amplitude controller 310 includes a super high frequency switch 256, a detector 257, a low frequency switch 258, two latches 259 and 260 and a comparator 261.

Most of components of the present invention are composed of passive devices so they are not much affected by the variation of an external environment such as a temperature and humidity.

Operations of the intermodulation signal detector are described below in detail.

The first power divider 240 receives a super high frequency signal from the outside through a super high frequency transmission line 201, divides the power of the inputted super high frequency signal and outputs one of power divided super high frequency signals through a super high frequency transmission line 202 to the fourth power divider 246 and the other power-divided super high frequency signal to the non-linear super high frequency element 243 via the variable attenuator 241 and the variable phase converter 242 by using super high frequency transmission lines 203 and 204.

The non-linear super high frequency element 243 transmits the inputted power-divided super high frequency signal together with an intermodulation signal to the second power divider 244, wherein the intermodulation signal is internally generated non-linear super high frequency element 243

And, the second power divider 244 divides the power of the power-divided super high frequency signal and the intermodulation signal provided from the non-linear super high frequency element 243 and supplies one of power-divided signals to the outside through a super high frequency transmission line 206 and the other power-divided signal to the third power divider 245 through a transmission line 207. The power-divided super high frequency signal and the intermodulation signal are provided to the third power divider 245 as a comparison signal for a reference signal on the super high frequency transmission line 202. The third power divider 245 divides the power of the comparison signal provided from the second power divider 244 and outputs power-divided signals and the intermodulation signal to the current combiner 262 as a comparison signal through a super high frequency transmission line 209 and to the fifth power divider 247 through a super high frequency transmission line 210.

Meanwhile, the fourth power divider 246 divides the power of the reference signal provided from the first power divider 240 and outputs power-divided signals to the power combiner 262 through a super high frequency transmission line 208 as a reference signal and to the sixth power divider 248 through a super high frequency transmission line 211. Herein, the power dividers 245 and 246 have an identical power-dividing characteristic.

The power combiner 262 is a Wilkinson-type signal combiner and cancels the super high frequency signal existed on the super high frequency transmission line 208 by the super high frequency signal on the super high frequency transmission line 209 when the signals on the super high frequency transmission lines 208 and 209 have the same amplitudes and the phase difference between them is 180°. Therefore, the power combiner 262 outputs only the intermodulation signal having the non-linear characteristic through a super high frequency transmission line 232.

At this time, in order to make the signals on the super high frequency transmission lines 208 and 209 having the same amplitudes and the phase difference between them 180°, the variable attenuator 241 and the variable phase converter 242 are controlled by using signals outputted from the phase controller 300 and the amplitude controller 310. A detailed control mechanism for the variable attenuator 241 and the variable phase converter 242 is described below.

The sixth power divider 248 provides power-divided signals to the super high frequency switch 256 of the amplitude controller 310 and the directional combiner 249 for the phase control at the phase controller 300.

The fifth power divider 247 provides power-divided signals to the directional combiner 249 for the phase control at the phase controller 300 and to the super high frequency switch 256 of the amplitude controller 310 for the amplitude control.

The directional combiner 249 receives the power-divided signals from the fifth and the sixth power dividers 247 and 248 through transmission lines 212 and 213 and then provides the received power-divided signals to the super high frequency switch 250 by using the super high frequency transmission lines 214 and 215.

Figure 3:
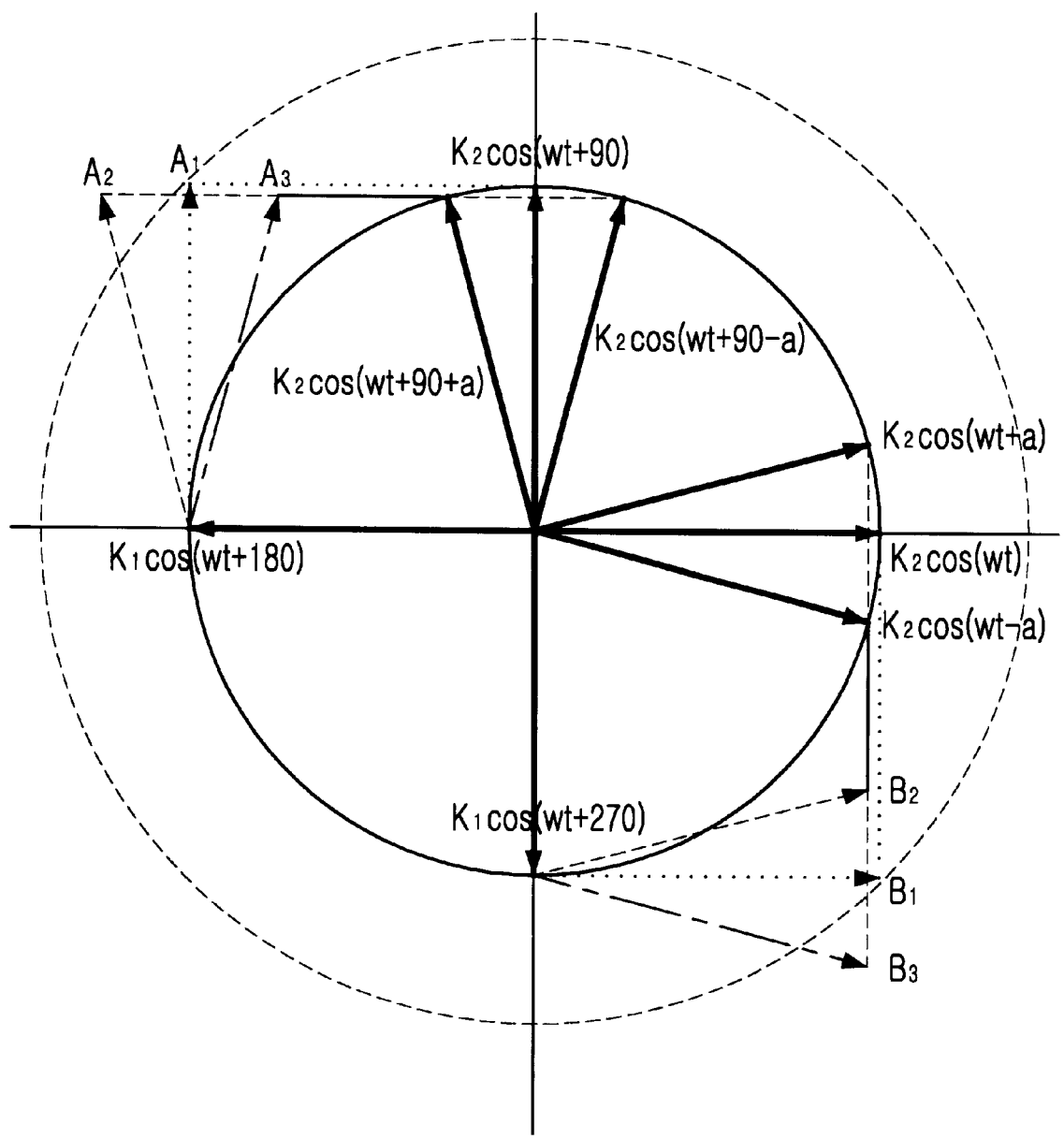
FIG. 3 shows a view of explaining an output signal of a directional combiner in FIG. 2.

The super high frequency switch 250 receives a clock signal generated by the clock generator 270 through a clock signal input transmission line 271 and performs a switching operation in a cycle of the inputted clock signal to thereby provide the detector 257 with an intermittent super high frequency signal through a super high frequency transmission line 216. FIG. 3 shows a view of explaining an output signal of the directional combiner 249.

If the signals provided through the super high frequency transmission lines 213 and 212 having the same amplitudes and the phase difference, 180°, between them are inputted to the directional combiner 249, the signals on the super high frequency transmission lines 214 and 215 have values "A1" and "B1", respectively, as shown in FIG. 3. Therefore, the two signals are detected at the detector 251 as having the same amplitude and then supplied to the low frequency switch 252 through a transmission line 217.

As illustrated in FIG. 3, if a phase of the signal on the comparison transmission line 212 inputted to the directional combiner 249 is faster as much as "a" than that of the signal on the reference transmission line 213, the signals on the super high frequency transmission lines 214 and 215 have values of "A2" and "B2". In this case, the amplitudes of the two signals are detected different at the detector 251 and the detector 251 provides the detected amplitude signals to the low frequency switch 252 through the transmission line 217.

In response to the clock signal supplied from the clock generator 270, the low frequency switch 252 provides DC voltages corresponding to the power of the signals on the transmission lines 214 and 215 to the latches 253 and 254 through transmission lines 218 and 219, respectively.

The latches 253 and 254 convert the DC voltages periodically inputted thereto to non-periodical constant DC voltages by using resistors and capacitors and provide the non-periodical constant DC voltages to the comparator 255 through transmission lines 220 and 221, respectively.

The comparator 255 provides a voltage for making the DC voltages of the transmission lines 220 and 221 having the same value to the variable phase converter 242 through a transmission line 222.

That is, if the DC voltage values of the transmission lines 220 and 221 are identical with each other, the phase difference between the signals on the transmission lines 212 and 213 becomes 180° and this means that the phase difference between the signals on the transmission lines 208 and 209 is 180°. Meanwhile, for the amplitude control performed by using the amplitude controller 310, the super high frequency switch 256 receives the signals on transmission lines 223 and 224 and provides them to the detector 257 through a transmission line 225 in response to the clock signal produced by the clock generator 270.

The detector 257 detects amplitudes of the signals provided from the super high frequency switch 256 and supplies a DC voltage corresponding to the detected amplitude to the low frequency switch 258 through a transmission line 226.

The low frequency switch 258 receives the clock signal through a transmission line 273, generates a DC voltage corresponding to the amplitude of the signal inputted through the transmission line 224 and applies it to the latch 259 through a transmission line 227.

Additionally, the low frequency switch 258 receives the clock signal through the transmission line 273, generates a DC voltage corresponding to the amplitude of the signal inputted through the transmission line 223 and applies it to the latch 260 through a transmission line 228.

The latches 259 and 260 convert the DC voltages periodically inputted thereto to non-periodic constant DC voltage by using resistors and capacitors and provide the non-periodic constant DC voltages to the comparator 261 through transmission line 229 and 239, respectively.

The comparator 261 controls the variable attenuator 241 to make the DC voltages of the transmission lines 229 and 230 have the same value by providing a control voltage to the variable attenuator 241 through a transmission line 231.

The intermodulation signal detector in accordance with the preferred embodiment of the present invention can be simply composed of only hardware circuitries and effectively detect intermodulation signals generated in the super high frequency element having the non-linear characteristic.

The intermodulation signal detector can stably detect intermodulation signals regardless of the variations of non-linear characteristics of the super high frequency element and an external environment by using combined two transmission lines on which signals have the same amplitude and 180° different phases.

While the present invention has been described with respect to certain preferred embodiments, it will be apparent to those skilled in the art that various changes and modifications may be made without departing from the scope of the invention as defined in the following claims.

What is claimed is:

1. An intermodulation signal detector for use in a super high frequency circuit, comprising:

a first power dividing means for dividing the power of a super high frequency signal inputted from the outside through a super high frequency transmission line, and outputting a power-divided signal;

a clock generating means for producing a clock signal;

a varying means for receiving the power-divided signal from the first power dividing means, attenuating an amplitude of the power-divided signal according to an amplitude control signal, converting a phase of the power-divided signal in response to a phase control signal and providing a converted super high frequency signal having converted amplitude and phase;

a non-linear super high frequency element for receiving the converted super high frequency signal and generating an output signal including the converted super high frequency signal and an intermodulation signal produced therein;

a second power dividing means for receiving the output signal of the non-linear super high frequency element, dividing the power of the output signal and outputting a power-divided output signal as a comparison signal;

a third power dividing means for receiving the power-divided signal from the first power dividing means, dividing the power of the power-divided signal and outputting a twice power-divided signal as a reference signal;

a power combining means for receiving the comparison signal and the reference signal and combining the received two signals to thereby detect the intermodulation signal;

a phase control means for receiving the comparison signal and the reference signal and generating DC voltages having amplitudes corresponding to the phases of two received signals to thereby produce the phase control signal for making 180° phase difference between the comparison signal and the reference signal; and an amplitude control means for receiving the comparison signal and the reference signal and generating DC voltages having amplitudes corresponding to the amplitudes of two received signals to thereby produce the amplitude control signal for making the amplitude of the comparison signal identical to that of the reference signal.

2. The intermodulation signal detector as recited in claim 1, wherein the varying means includes:

a variable attenuating means for receiving the power-divided signal from the first power dividing means and attenuating an amplitude of the power-divided signal according to the amplitude control signal; and a variable phase converting means for receiving an amplitude-attenuated signal from the variable attenuating means and converting the phase of the amplitude-attenuated signal according to the phase control signal to thereby provide the converted super high frequency signal to the non-linear super high frequency element.

3. The intermodulation signal detector as recited claim 1, wherein the second and the third power dividing means have a plurality of power dividers in a cascade connection.

4. The intermodulation signal detector as recited claim 1, wherein the phase control means includes:

a directional combining means for receiving the comparison signal and the reference signal and generating signals whose amplitudes correspond to the phases of two received signals; and a phase control signal generating means for receiving output signals from the directional combining means, generating the DC voltages whose amplitudes correspond to amplitudes of said output signals and producing the phase control signal by comparing said DC voltages to each other.

5. The intermodulation signal detector as recited in claim 4, wherein the directional combining means is a Wilkinson-type combiner.

6. The intermodulation signal detector as recited in claim 4, wherein the phase control signal generating means has:

a super high frequency switch for receiving said output signals from the directional combining means and the clock signal and outputting said output signals according to a cycle of the clock signal to thereby produce switched signals;

a detector for receiving the switched signals from the super high frequency switch, detecting amplitudes of the switched signals and outputting DC voltages corresponding to the detected amplitudes;

a low frequency switch for receiving said DC voltages and the clock signal and outputting said DC voltages according to the cycle of the clock signal to thereby generate switched DC voltages;

a delay means for receiving the switched DC voltages from the low frequency switch, converting the received DC voltages to constant DC voltages and outputting converted DC voltages; and a comparison means for comparing a converted DC voltage corresponding to the reference signal and a converted DC voltage corresponding to the comparison signal to thereby generate the phase control signal.

7. The intermodulation signal detector as recited in claim 1, wherein the amplitude controlling means includes:

a super high frequency switch for receiving the comparison signal, the reference signal and the clock signal and outputting the received reference signal and comparison signal according to a cycle of the clock signal to thereby provide switched signals;

a detector for receiving the switched signals from super high frequency switch, detecting amplitudes of the switched signals and outputting DC voltages corresponding to the detected amplitudes;

a low frequency switch for receiving said DC voltages and the clock signal and outputting the DC voltages according to the cycle of the clock signal to thereby provide switched DC voltages;

a delay means for receiving the switched DC voltages and converting the switched DC voltages to constant DC voltages to thereby output converted DC voltages; and a comparison means for comparing the converted DC voltages corresponding to the reference signal and the comparison signal, respectively, to each other to thereby generate the amplitude control signal.

* * * * *